(12) United States Patent
Alaoui

(10) Patent No.: US 10,115,447 B2
(45) Date of Patent: Oct. 30, 2018

(54) LOGIC GATE MODULE FOR PERFORMING LOGIC FUNCTIONS COMPRISING A MRAM CELL AND METHOD FOR OPERATING THE SAME

(71) Applicant: CROCUS Technology SA, Grenoble (FR)

(72) Inventor: Ali Alaoui, Aix-en-Provence (FR)

(73) Assignee: CROCUS TECHNOLOGY SA, Grenoble (FR)

( * ) Notice: Subject to any disclaimer, the term of this patent is extended or adjusted under 35 U.S.C. 154(b) by 0 days.

(21) Appl. No.: 15/565,505

(22) PCT Filed: Apr. 6, 2016

(86) PCT No.: PCT/IB2016/051940
§ 371 (c)(1),
(2) Date: Oct. 10, 2017

(87) PCT Pub. No.: WO2016/166639
PCT Pub. Date: Oct. 20, 2016

(65) Prior Publication Data
US 2018/0075896 A1    Mar. 15, 2018

(30) Foreign Application Priority Data
Apr. 13, 2015    (EP) .................................. 15290097

(51) Int. Cl.
*G11C 11/00* (2006.01)
*G11C 11/16* (2006.01)
(Continued)

(52) U.S. Cl.
CPC ...... *G11C 11/1675* (2013.01); *G11C 11/1673* (2013.01); *G11C 11/5607* (2013.01);
(Continued)

(58) Field of Classification Search
CPC . G11C 11/1675; G11C 11/5607; H03K 19/20; H01L 27/228; H01L 43/08; H01L 43/10
(Continued)

(56) References Cited

U.S. PATENT DOCUMENTS 6,809,981 B2 * 10/2004 Baker .................... G11C 11/16
365/158
7,224,566 B2 * 5/2007 Baskin, legal representative .......
G11C 11/15
361/143

(Continued)

OTHER PUBLICATIONS

International Search Report for PCT/IB2016/051940 dated Jun. 27, 2016.

(Continued)

*Primary Examiner* — Gene Auduong
(74) *Attorney, Agent, or Firm* — Pearne & Gordon LLP

(57) ABSTRACT

A logic gate module for performing logic functions including a MRAM cell including a magnetic tunnel junction comprising a sense layer, a storage layer, and a spacer layer. The MRAM cell has a junction resistance determined by the degree of alignment between a sense magnetization of the sense layer and the storage magnetization of the storage layer. The storage magnetization and the sense magnetization are switchable between m directions to store data corresponding to one of m logic states, with m>2, such that the MRAM cell is usable as a n-bit cell with n≥2. The logic gate module further includes a comparator for comparing the junction resistance with a reference value and outputting a digital signal indicating a difference between the junction resistance and the reference value, such that logic functions can be performed.

12 Claims, 10 Drawing Sheets

(51) Int. Cl.
  *G11C 11/56* (2006.01)
  *H03K 19/20* (2006.01)
  *H01L 27/22* (2006.01)
  *H01L 43/08* (2006.01)
  *H01L 43/10* (2006.01)

(52) U.S. Cl.
  CPC ............ *H03K 19/20* (2013.01); *H01L 27/228* (2013.01); *H01L 43/08* (2013.01); *H01L 43/10* (2013.01)

(58) Field of Classification Search
  USPC .................... 365/100, 148, 158, 171, 173
  See application file for complete search history.

(56) References Cited

U.S. PATENT DOCUMENTS

| 8,717,794 B2* | 5/2014 | Cambou | .................... G06F 7/02 365/49.1 |
|---|---|---|---|
| 2012/0143889 A1 | 6/2012 | Cambou et al. | |

OTHER PUBLICATIONS

Written Opinion for PCT/IB2016/051940 dated Jun. 27, 2016.

Hesjedal T et al: "Magnetic logic element based on an S-shaped Permally structure", Applied Physics Letters, American Institute of Physics, 2 Huntington Quadrangle, Melville, NY 11747, vol. 96, No. 7, Feb. 16, 2010, XP012132223.

Ney A et al: "Reconfigureable magnetologic computing using the spin flop switching of a magnetic random access memory cell", Applied Physics Letters, American Institute of Physics, 2 Huntington Quadrangle, Melville, NY 11747, vol. 86, No. 1, Dec. 23, 2004, XP012064476.

Prejbeanu I L et al: "Thermally assisted MRAMs: ultimate scalability and logic functionalities", Journal of Physics D: Applied Physics, Institute of Physics Publishing Ltd, GB, vol. 46, No. 7, Feb. 1, 2013, XP020237319.

* cited by examiner

|  | Fig. 6(a) | Fig. 6(b) | Fig. 6(c) | Fig. 6(d) |
|---|---|---|---|---|
| 230: | ← | ← | ← | ← |
| 210: | → | ↑ | ↓ | ← |
| $R_{ref} = R_{max}$ | 0 | 1 | 1 | 1 |
| $R_{ref} = R_{min}$ | 0 | 0 | 0 | 1 |

|  | Fig. 8(a) | Fig. 8(b) | Fig. 8(c) | Fig. 8(d) |
|---|---|---|---|---|
| 230: |  |  |  |  |
| 210: |  |  |  |  |
| user input | 00 | 01 | 10 | 11 |
|  | 0 | 1 | 1 | 0 |
|  | Fig. 9(a) | Fig. 9(b) | Fig. 9(c) | Fig. 9(d) |
|---|---|---|---|---|
| 230: |  |  |  |  |
| 210: |  |  |  |  |
| $R_{ref} = R_{max}$ | 1 | 1 | 0 | 1 |
| $R_{ref} = R_{min}$ | 0 | 1 | 0 | 0 |

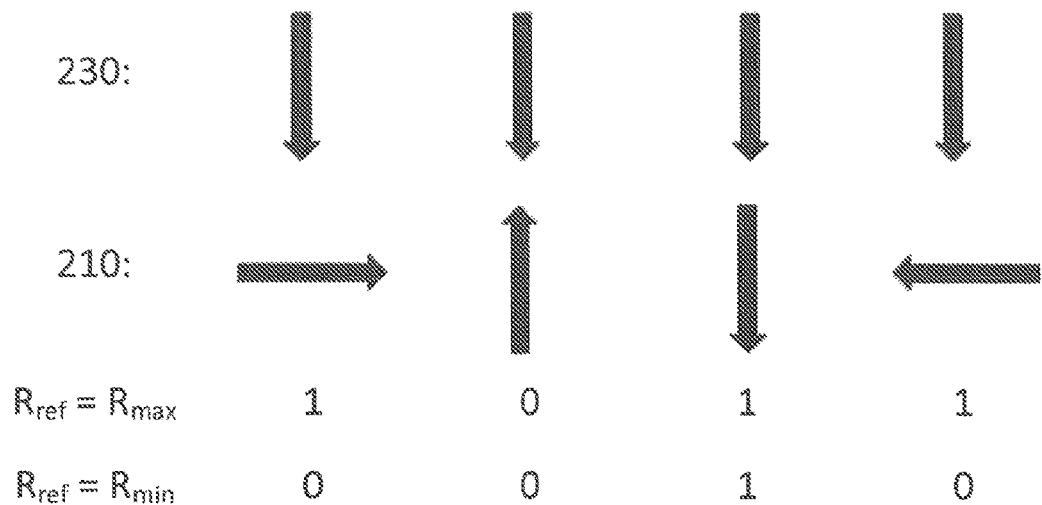
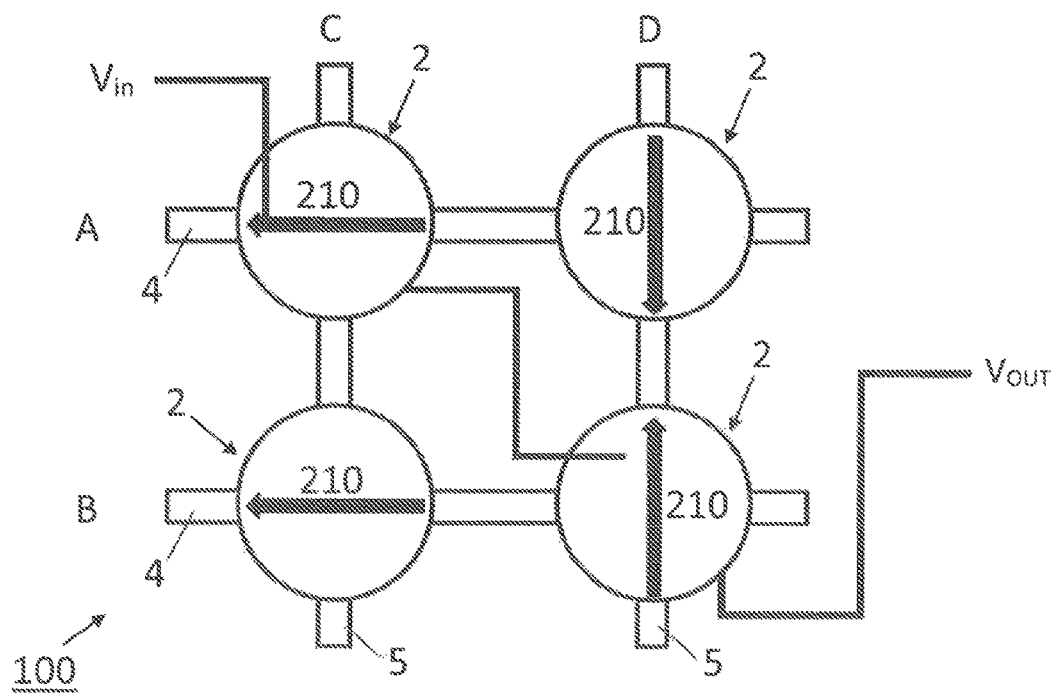
Fig. 11

| D | User input | | Field Line | | Rmax | | | | Rmin | | | |
|---|---|---|---|---|---|---|---|---|---|---|---|---|
|   | A | B | FL1 | FL2 | OR | A+B̄ | Ā+B | NAND | NOR | Ā.B | A.B̄ | AND |
| 0 | 0 | 0 | 1  | 0  | 0 | 1 | 1 | 1 | 1 | 0 | 0 | 0 |
| 0 | 0 | 1 | 0  | 1  | 1 | 0 | 1 | 1 | 0 | 1 | 0 | 0 |
| 0 | 1 | 0 | -1 | 0  | 1 | 1 | 0 | 1 | 0 | 0 | 1 | 0 |
| 0 | 1 | 1 | 0  | -1 | 1 | 1 | 1 | 0 | 0 | 0 | 0 | 1 |
| 1 | 0 | 0 | 1  | 1  | 1 | 1 | 1 | 1 | 0 | 0 | 0 | 0 |
| 1 | 0 | 1 | -1 | 1  | 1 | 1 | 1 | 1 | 0 | 0 | 0 | 0 |
| 1 | 1 | 0 | 1  | -1 | 1 | 1 | 1 | 1 | 0 | 0 | 0 | 0 |
| 1 | 1 | 1 | -1 | -1 | 1 | 1 | 1 | 1 | 0 | 0 | 0 | 0 |

Fig. 15

LOGIC GATE MODULE FOR PERFORMING LOGIC FUNCTIONS COMPRISING A MRAM CELL AND METHOD FOR OPERATING THE SAME

FIELD

The present invention concerns a logic gate module for performing logic functions that can be reprogrammable and that has reduced risk of being copied. The invention also relates to a method for operating the logic gate module.

DESCRIPTION OF RELATED ART

Current logic gates are based on CMOS technology. Once designed, these gates cannot be reprogrammed. Moreover, the graphic data system (GDS) file must be highly confidential to protect the IP. CMOS chips can be de-processed and reverse engineered.

Document: Prejbeanu I. L., et. al., "Thermally assisted MRAMs ultimate scalability and logic functionalities", Journal of Physics D: Applied Physics, Volume 46, Number 7, (2013 Feb. 1), page 74002, is focused on thermally assisted magnetic random access memories (TA-MRAMs). The document describes functionalities particularly useful for security applications (so-called Match-in-Place™ technology).

US2012143889 discloses a check engine including a plurality of comparators each including a magnetic random access memory (MRAM) cell configured to store at least one reference bit and at least one target bit, and configured to produce an output representing a level of matching between the at least one target bit and the at least one reference bit.

Hesjedal T. et. Al., "Magnetic logic element based on an S-shaped permalloy structure", Appl. Phys. Lett. 96, 072501 (2010), describes a magnetic logic device element that consists of a single magnetic layer. Its output can be controlled by orthogonal magnetic inputs.

Ney A et. Al., "Reconfigurable magnetologic computing using the spin flop switching of a magnetic random access memory cell", Appl. Phys. Lett. 86, 013502 (2005), describes using a single MRAM cell as either NOT, AND, or NAND gates, and using bipolar current to make XOR and XNOR feasible as well. The actual functionality can be pre-programmed at run-time and the output is nonvolatile.

SUMMARY

The present disclosure concerns a logic gate module for performing logic functions comprising a MRAM cell including a magnetic tunnel junction comprising a sense layer having a sense magnetization, a storage layer having a storage magnetization, and a spacer layer between the sense and the storage layers, the MRAM cell having a junction resistance determined by the degree of alignment between the sense magnetization and the storage magnetization; wherein, during a programming operation, the storage magnetization is switchable between m directions to store data corresponding to one of m logic states, with m>2; wherein, during a user input operation, the sense magnetization is switchable between m directions in accordance with a user input, such that the MRAM cell is usable as a n-bit cell with n≥2; and wherein logic gate module further comprises a comparator for comparing the junction resistance with a reference value and outputting a digital signal indicating a difference between the junction resistance ($R_{MTJ}$) and the reference value, such that logic functions can be performed.

The present disclosure further pertains to a method for operating the logic gate module; comprising:

during a programming operation, programming the storage magnetization in one of the m directions to store data corresponding to one of m logic states;

providing a reference value to the comparator;

during a user input operation, activating at least one of the first field line and the second field line to induce a set of read magnetic fields to vary the sense magnetization from an initial one of m directions to another one of the m directions;

measuring a junction resistance of the magnetic tunnel junction; and comparing the junction resistance of the magnetic tunnel junction with the reference value.

The logic gate module disclosed herein can be reprogrammed resulting in an increase of area/performance ratio.

The GDS file of IP-based on the logic gate module based on the MRAM cell is not confidential and thus, the risk of copycats is eliminated. Moreover, the logic gate module based on the MRAM cell is "normally off" such that there is zero leakage when the gates are not used.

BRIEF DESCRIPTION OF THE DRAWINGS

The invention will be better understood with the aid of the description of an embodiment given by way of example and illustrated by the figures, in which:

FIGS. 6(a)-(d) schematically shows the relative orientations of the storage magnetization and the sense magnetization for the logic gate module used as a 2-bit configuration, according to another embodiment;

FIGS. 8(a)-(d) schematically shows the relative orientations of the storage magnetization and the sense magnetization for the logic gate module used as a 1-bit configuration;

FIGS. 9(a)-(d) schematically shows the relative orientations of the storage magnetization and the sense magnetization for the logic gate module used as a 2-bit configuration, according to yet another embodiment;

FIGS. 10(a)-(d) schematically shows the relative orientations of the storage magnetization and the sense magnetization for the logic gate module used as a 2-bit configuration, according to yet another embodiment;

FIG. 11 shows a logic gate module, according to another embodiment;

FIG. 15 shows a table reporting a plurality of combinations of the first read current and second read current, according to yet another embodiment.

DETAILED DESCRIPTION OF POSSIBLE EMBODIMENTS

Figure 1:
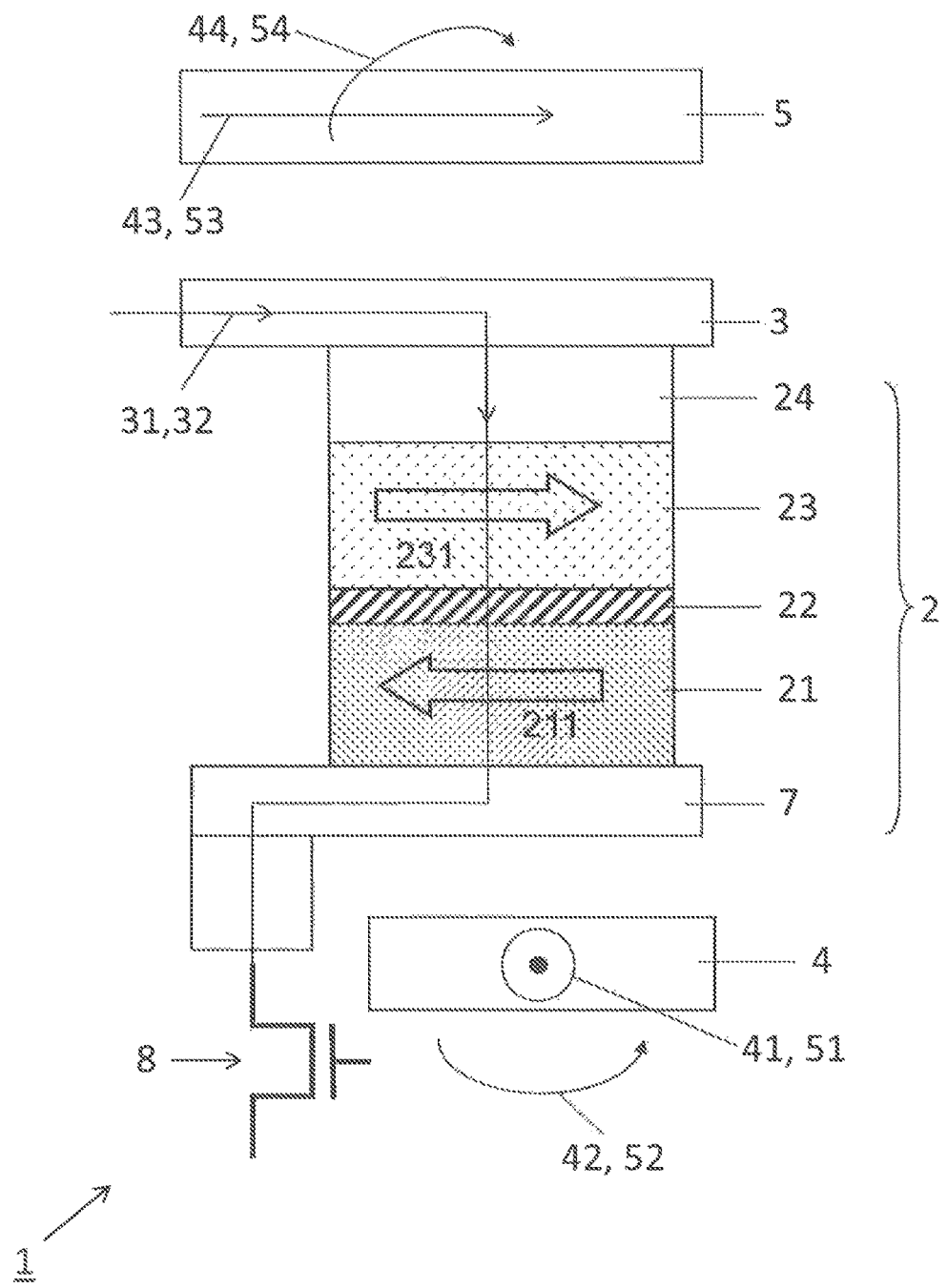
FIG. 1 illustrates an MRAM cell, according to an embodiment.

FIG. 1 illustrates an MRAM cell 1, according to an embodiment. The MRAM cell 1 includes a magnetic tunnel junction 2, which includes a sense layer 21, a storage layer 23, and a spacer layer, or tunnel barrier layer, 22 that is disposed between the sense layer 21 and the storage layer 23. The sense layer 21 has a sense magnetization 210 and the storage layer 23 has a storage magnetization 230.

As illustrated in FIG. 1, a bit line 3 is electrically coupled to the magnetic tunnel junction 2 on the side of the sense layer 21. A first field line 4 is magnetically coupled to the magnetic tunnel junction 2 on the side of the storage layer 23 and a second field line 5 is substantially orthogonal to a field line 4 and magnetically coupled to the magnetic tunnel junction 2 on the side of the storage layer 23. The MRAM cell 1 also includes a selection transistor 8, which is electrically coupled, through a strap 7, to the magnetic tunnel junction 2 on the side of the storage layer 23. Other implementations of the MRAM cell 1 are contemplated. For example, the relative positioning of the sense layer 21 and the storage layer 23 can be reversed in the magnetic tunnel junction 2, with the storage layer 23 disposed above the sense layer 21.

Each of the sense layer 21 and the storage layer 23 includes, or is formed of, a magnetic material and, in particular, a magnetic material of the ferromagnetic type. A ferromagnetic material can be characterized by a substantially planar magnetization with a particular coercivity, which is indicative of a magnitude of a magnetic field to reverse the magnetization after it is driven to saturation in one direction. In general, sense layer 21 and the storage layer 23 can include the same ferromagnetic material or different ferromagnetic materials. Suitable ferromagnetic materials include transition metals, rare earth elements, and their alloys, either with or without main group elements. For example, suitable ferromagnetic materials include iron ("Fe"), cobalt ("Co"), nickel ("Ni"), and their alloys, such as permalloy (or Ni80Fe20); alloys based on Ni, Fe, and boron ("B"); Co90Fe10; and alloys based on Co, Fe, and B. In some instances, alloys based on Ni and Fe (and optionally B) can have a smaller coercivity than alloys based on Co and Fe (and optionally B). A thickness of each of the sense layer 21 and the storage layer 23 can be in the nanometer ("nm") range, such as from about 0.3 nm to about 20 nm or from about 1 nm to about 10 nm. A thickness of the storage layer 23 is preferably from about 0.3 nm to about 5 nm.

The spacer layer 22 can include, or can be formed of, an insulating material. Suitable insulating materials include oxides, such as aluminum oxide (e.g., $Al_2O_3$) and magnesium oxide (e.g., MgO). A thickness of the tunnel barrier layer 22 can be in the nm range, such as from about 0.5 nm to about 10 nm.

Other implementations of the sense layer 21 and the storage layer 23 are contemplated. For example, the sense layer 21 and/or the storage layer 23 can include multiple sub-layers in a fashion similar to that of the so-called synthetic antiferromagnet (SAF), or synthetic ferrimagnet (SyF) layer. For example, the sense layer 21 can comprise two reference ferromagnetic layers, each having a reference magnetization. A reference coupling layer can be included between the two reference ferromagnetic layers and producing a magnetic coupling, namely a RKKY coupling, between the two reference magnetizations. Similarly, the storage layer 23 can comprise two storage ferromagnetic layer, each having a storage magnetization. A storage coupling layer can be included between the two storage ferromagnetic layer and magnetically coupling the two storage magnetizations.

The magnetic tunnel junction 2 can further include a storage pinning layer 24 which is disposed adjacent to the storage layer 23 and, through exchange bias, pins the storage magnetization 230 along a particular direction, when a temperature within, or in the vicinity of, the pinning layer 24 at a low threshold temperature $T_L$, i.e., below a threshold temperature such as a blocking temperature, a Neel temperature, or another threshold temperature. The pinning layer 24 unpins, or decouples, the storage magnetization 23 when the temperature is at a high threshold temperature $T_H$, i.e., above the threshold temperature, thereby allowing the storage magnetization 230 to be switched to another direction.

The storage pinning layer 24 can include, or can be formed of, magnetic materials and, in particular, magnetic materials of the antiferromagnetic type. Suitable antiferromagnetic materials include transition metals and their alloys. For example, suitable antiferromagnetic materials include alloys based on manganese ("Mn"), such as alloys based on iridium ("Ir") and Mn (e.g., IrMn); alloys based on Fe and Mn (e.g., FeMn); alloys based on platinum ("Pt") and Mn (e.g., PtMn); and alloys based on Ni and Mn (e.g., NiMn).

The sense magnetization 210 is preferably unpinned and can be readily varied, with the substantial absence of exchange bias. In this configuration, the sense layer 21 behaves like a free layer in a self-referenced magnetic tunnel junction 2. If the sense layer 21 is a SAF layer, one of the sense ferromagnetic layers has a first soft reference magnetization and the other reference ferromagnetic layer has a second soft reference magnetization.

Figure 2:
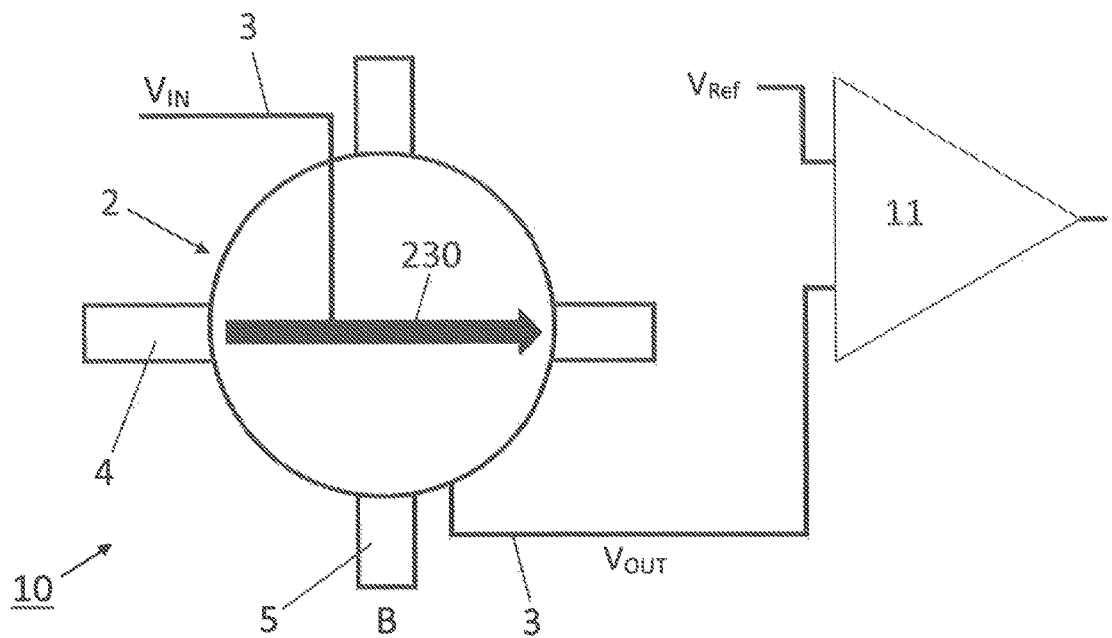
FIG. 2 shows a logic gate module, according to an embodiment.

FIG. 2 shows a logic gate module 10 for performing logic functions, according to an embodiment. The logic gate module 10 comprises the MRAM cell 1 and a comparator 11 having one input connected to the bit line 3 and another input connected to a reference value $R_{ref}$. The comparator can be a sense amplifier 11. The storage layer 23 of the MRAM cell 1 can be programmed in at least four logic states, as discussed below.

According to an embodiment, a method for operating the logic gate module 10 comprises:

programming the storage layer 23 such as to orient the storage magnetization 230 in a programmed direction;

inputting a "user input" in the sense layer 21 such as to orient the sense magnetization 210 in a read direction;

once the user input has been inputted in the sense layer 21, measuring a junction resistance $R_{MTJ}$ of the magnetic tunnel junction 2;

providing the reference value $R_{ref}$ to the sense amplifier 11; and comparing the junction resistance $R_{MTJ}$ with the reference value $R_{ref}$.

Programming the storage layer 23 can comprises a TAS-type programming operation of the MRAM cell 1. During a TAS-type programming operation of the MRAM cell 1, the magnetic tunnel junction 2 is heated by applying a heating current 31 through the magnetic tunnel junction 2 via the bit line 3, with the selection transistor 8 in a saturated mode. The magnetic tunnel junction 2 is heated to a high threshold temperature $T_H$ of the storage pinning layer 24 such that the storage magnetization 230 is unpinned.

Simultaneously or after a short time delay, at least one of the first field line 4 and the second field line 5 is activated to induce a set of programming magnetic fields 42, 52 to switch the storage magnetization direction 230 from an initial one of m directions to another one of the m directions. Specifically, a first programming current 41 can be applied through the first field line 4 to induce a first programming magnetic field 42 to switch the storage magnetization direction 230 accordingly. Alternatively, or in combination, a second programming current 51 can be applied through the second field line 5 to induce a second programming magnetic field 52 to switch the storage magnetization direction 230 accordingly.

The logic gate module 10 can be used as a n-bit configuration in the case the MRAM cell 1 is operated as an axial induced moment MRAM cell. In an axial induced moment (AIM) MRAM cell, the magnetic moment vector of the storage magnetization and of the sense magnetization can be varied in a plurality of angles such that binary data can be encoded in the MRAM cell 1. For example, the axial induced moment MRAM cell can be operated as a 2-bit or 4-bit cell.

Figure 3:
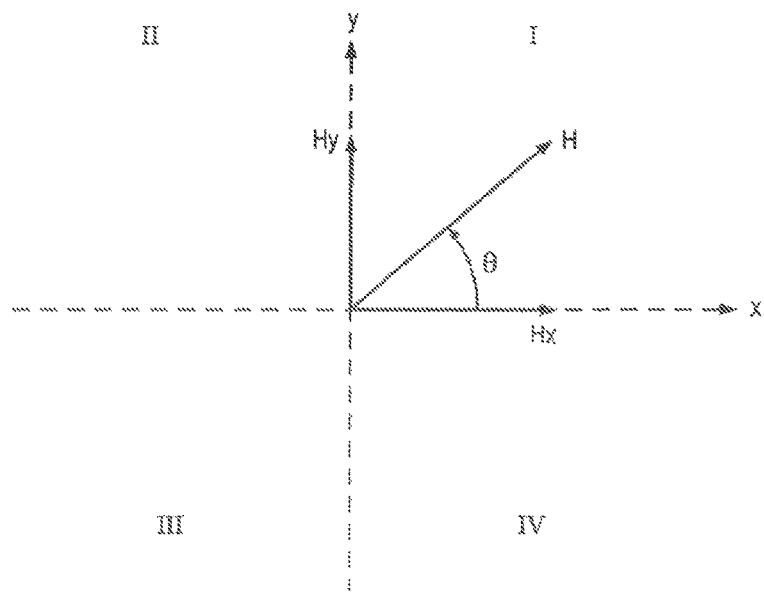
FIG. 3 illustrates write magnetic fields projected along a plane, according to an embodiment.

The write operation of the AIM-M RAM cell 1 can be further understood with reference to FIG. 3 which illustrates the first and second programming magnetic fields 42 and 52 projected along a plane (here, an x-y plane) in which the storage magnetization direction 230 is switchable. Specifically, Hx represents the x-component of the first programming magnetic field 41 when projected along the plane, and Hy represents the y-component of the second programming magnetic field 52 when projected along the plane. By combining Hx and Hy, a resultant write magnetic field, which is represented as H, is generated with an orientation at an angle θ relative to the positive x-axis, where θ=arctangent (Hy/Hx) when H lies in quadrant I, θ=180°+arctangent (Hy/Hx) when H lies in quadrant II or III, and θ=360°+arctangent (Hy/Hx) when H lies in quadrant IV. By varying the signs and magnitudes of Hx and Hy, namely by varying the directions and magnitudes of the first and second programming currents 41, 52 through the first field line 4 and the second field line 5, distinct values of θ are obtained in the range of 0° to 360°. Because the storage magnetization direction can be aligned according to θ, m logic states can be encoded, with each logic state assigned to a distinct value of θ.

For certain implementations, m is represented as m=2<n>, with n≥2. Here, the AIM-MRAM cell 1 is an n-bit cell that stores an n-bit data value. One possible write encoding scheme assigning m logic states to m distinct values of θ. In the case that m=4 and n=2, one possible write encoding scheme assigning four logic states to four distinct values of θ. It should be understood that other write encoding schemes are contemplated. For example, the assignment between m logic states and m distinct values of θ can be permuted, such that the logic state "00" is assigned to 90° (instead of 0°), the logic state "01" is assigned to 0° (instead of 90°), and so forth. As another example, an offset can be added to some, or all, of the values of θ, such that the logic state "00" is assigned to 0°+offset, the logic state "01" is assigned to 90°+offset, and so forth. As further examples, an increment between successive values of θ can be variable, rather than a constant, and certain of the m logic states and certain of the m distinct values of θ can be omitted.

Figures 4, 5A, 5B, 5C, 5D:
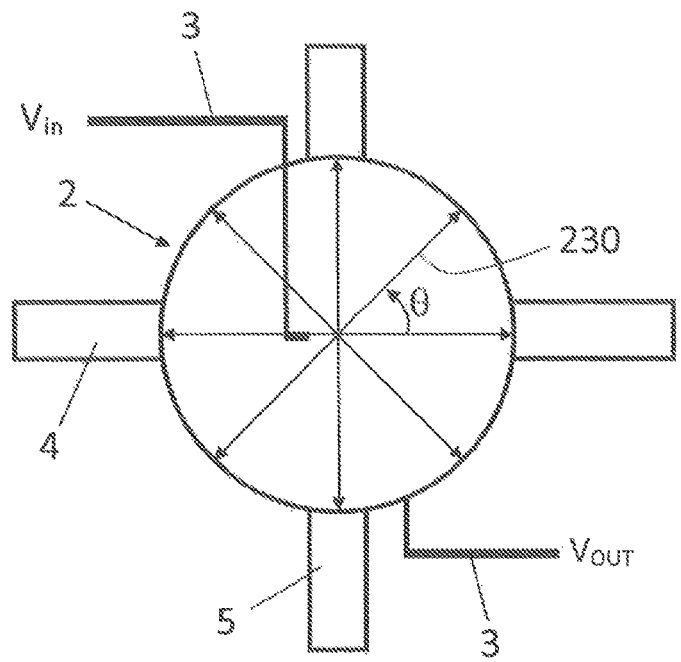
FIG. 4 shows a top view of the magnetic tunnel junction, according to an embodiment.
FIGS. 5(a)-(d) schematically shows the relative orientations of the storage magnetization and the sense magnetization for the logic gate module used as a 2-bit configuration, according to an embodiment.
Figure 7A:
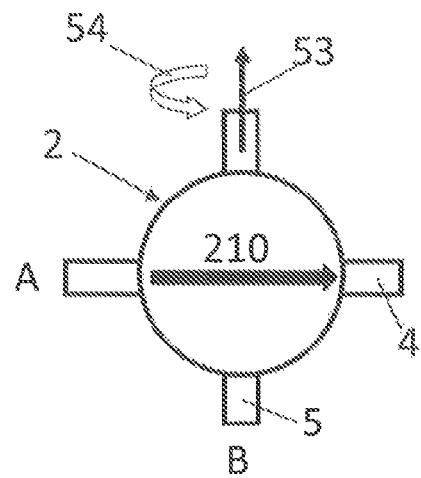
FIGS. 7(a)-(d) shows a top view of the MRAM cell illustrating a sequence of activation of the first and second field lines, according to an embodiment.
Figure 7B:
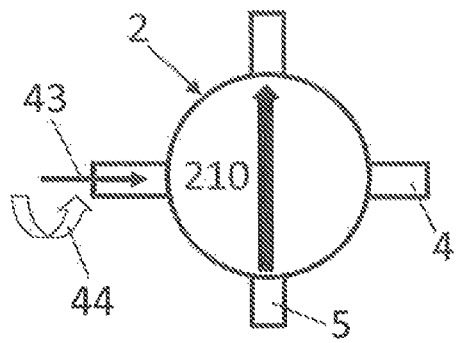
Figure 7C:
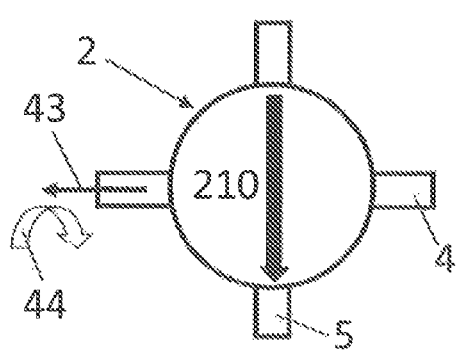
Figure 7D:
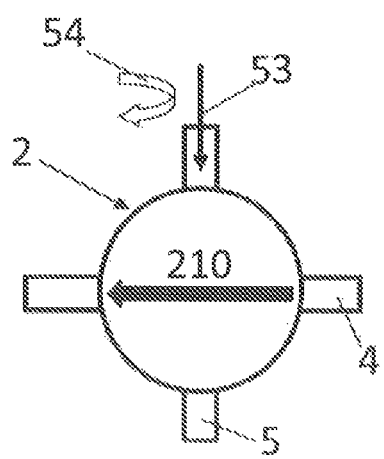

FIG. 4 shows a top view of the magnetic tunnel junction 2 with the bit line 3 and the first and second field lines 4, 5. The arrows represent eight distinct orientations of the storage magnetization 230, corresponding to eight distinct logic states (m=8).

Inputting a "user input" in the sense layer 21 comprises activating at least one of the first field line 4 and the second field line 5 to induce a set of read magnetic fields 44, 54 to vary a direction of the sense magnetization 210.

Specifically, a first read current 43 can be applied through the first field line 4 to induce a first read magnetic field 44 to vary the sense magnetization 210 direction accordingly. Alternatively, or in combination, a second read current 53 can be applied through the second field line 5 to induce a second read magnetic field 54 to vary the sense magnetization 210 direction accordingly. Because the sense layer 21 is subject to little or no exchange bias, the sense magnetization 210 direction can be readily varied under low-intensity magnetic fields and at the low threshold temperature $T_L$, while the storage magnetization 230 direction remains stable in the programmed direction.

Alternatively, the bit line 3 can be used as another field line instead of the second field line 5. In that case, at least one of the first field line 4 and the bit line 3 (acting as a field line) is activated to induce the set of programming magnetic fields 42, 52 to switch the storage magnetization direction 230 from an initial one of m directions to another one of the m directions. In particular, the second programming current 51 can be applied through the bit line 3 to induce a second programming magnetic field 52 to switch the storage magnetization direction 230 accordingly. In such a configuration, the AIM-M RAM cell 1 can be provided without the second filed line 5.

Measuring a junction resistance $R_{MTJ}$ of the AIM-MRAM cell 1 can be performed by applying a sense current 32 though the magnetic tunnel junction 2 via the bit line 3, with the selection transistor 8 in a saturated mode. Measuring a resulting voltage across the magnetic tunnel junction 2 when the sense current 32 is applied yields a resistance value of the magnetic tunnel junction 2, or junction resistance $R_{MTJ}$, for a particular read cycle and for a particular value of θ. In other words, the junction resistance $R_{MTJ}$ reflects the degree of alignment between the sense magnetization 210 direction and the storage magnetization 230 direction.

Alternatively, the junction resistance $R_{MTJ}$ can be determined by applying a voltage across the magnetic tunnel junction 2 and measuring a resulting current. When the sense magnetization 210 and storage magnetization 230 are antiparallel, the junction resistance $R_{MTJ}$ typically corresponds to a maximum value, namely $R_{max}$, and, when the respective magnetizations are parallel, the junction resistance $R_{MTJ}$ typically corresponds to a minimum value, namely $R_{min}$. When the respective sense and storage magnetizations 210, 230 are between antiparallel and parallel, the junction resistance $R_{MTJ}$ is typically between $R_{max}$ and $R_{min}$. Resistance values for multiple read cycles are processed to determine which value of θ yielded a minimum resistance value $R_{min}$, thereby yielding a stored multi-bit data value based on which of m logic states is assigned to that value of θ. Processing of the resistance values can be carried out using a suitable controller in combination with, for example, a sample/hold circuit.

The read operation of the AIM-M RAM cell 1 explained above is self-referenced, since it can be carried out based on the relative alignment of the sense and storage magnetizations 210, 230, without requiring a comparison to a reference cell or a group of reference cells.

Other implementations of self-referenced read operations are contemplated. For example, a faster speed of reading can be achieved by skipping certain of m logic states, with a junction resistance $R_{MTJ}$ corresponding to a skipped logic state determined by interpolation from adjacent logic states. A faster speed of reading also can be achieved by skipping certain of m logic states and using a suitable search technique to locate a minimum resistance value, such as by leveraging symmetries, incremental changes, or curvature related to resistance values of a subset of the m logic states.

The measured junction resistance $R_{MTJ}$ is compared to the reference value $R_{ref}$ provided to the sense amplifier 11.

In an embodiment, the logic gate module 10 can be operated as a 2-bit device. Specifically, the storage magnetization 230 and the sense magnetization 210 can be oriented in four different directions corresponding to four distinct logic states.

FIG. 5 schematically shows the storage magnetization 230 oriented in a programmed direction (pointing towards the right in FIG. 5). A user input is then inputted in the layer 21 such as to orient the sense magnetization 210 in a read direction. Specifically, the sense magnetization is successively oriented in a direction parallel to the storage magnetization 230 yielding a low junction resistance $R_{MTJ}=R_{min}$ (FIG. 5a), orthogonal to the storage magnetization 230 yielding a intermediate junction resistance $R_{MTJ}=R_{int}=(R_{max}+R_{min})/2$ (FIGS. 5b and 5c), and antiparallel to the storage magnetization 230 yielding a high junction resistance $R_{MTJ}=R_{max}$ (FIG. 5d). Here, matching occurs when the user input orients the sense magnetization 210 antiparallel to the storage magnetization 230 (FIG. 5d), corresponding to the junction resistance $R_{MTJ}$ being high ($R_{MTJ}=R_{max}$), and when the reference value $R_{ref}=R_{max}$ is provided to the sense amplifier 11. Consequently, a "NAND" logic gate can be obtained by using the logic gate module 10 of FIG. 2 in a 2-bit configuration.

FIG. 7 illustrates how the first and second field lines 4, 5 are activated in order to input the "read input" in the sense layer 21. In FIG. 7a, the second read current 53 is passed in the second field line 5 in a direction such as to induce the second read magnetic field 54 that switches the sense magnetization 210 towards the right. In FIG. 7d, the second read current 53 is passed in the second field line 5 with an opposite polarity such that the second read magnetic field 54 switches the sense magnetization 210 towards the left. In FIG. 7b, the first read current 43 is passed in the first field line 4 in a direction such as to induce the first read magnetic field 44 oriented such as to switch the sense magnetization 210 upwards. The sense magnetization 210 can be switched downwards when the first read current 43 is passed in the first field line 4 with an opposed polarity (FIG. 7c).

Table 1 reports the read current combinations described above and for the storage magnetization 230 being programmed in the direction shown in FIG. 5. In table 1, the field line 4, 5 are also represented as input "A" and "B", respectively (see FIG. 7a). No read current passed in the field line 4, 5 is represented by the sign "0", a positive read current 43, 53 respectively passing in the first and second field line 4, 5 is represented by the sign "1", and a negative read current 43, 53 respectively passing in the first and second field line 4, 5 is represented by the sign "−1". The user input corresponds to the relative orientations of the storage magnetization 230 and of the sense magnetization 210.

Here, the logic gate module 10 is used as a "NAND" logic gate. A match "0" is obtained when the sense magnetization 210 is oriented antiparallel to the storage magnetization 230 (corresponding to a high junction resistance $R_{MTJ}=R_{max}$) and when the reference value $R_{ref}=R_{max}$ is provided to the sense amplifier 11. Only one field line 4, 5 needs to be activated for each user input inputting operation. The above configuration allows for eight possible read current 43, 53 combinations that can be coded using a 3-bit input (the two read inputs and the reference value).

TABLE 1

| user input | | read current | |
|---|---|---|---|
| A | B | first field line | second field line |
| 0 | 0 | 1 | 0 |
| 0 | 1 | 0 | 1 |
| 1 | 0 | −1 | 0 |
| 1 | 1 | 0 | −1 |

The logic gate module 10 having the storage magnetization 230 programmed in a direction as shown in FIG. 5 can be used as a "NOR" logic gate by providing the reference value $R_{ref}$ to the sense amplifier 11 with a low resistance value ($R_{ref}=R_{min}$).

In order to use the "NAND" logic gate module 10 as a "OR" logic gate module 10, the storage magnetization 230 needs to be reprogrammed such that the AIM-MRAM cell 1 provides a match "0" when the users input A=0 and B=0 (see FIG. 6). In that case, the storage magnetization 230 is programmed in a direction opposed to the one when the logic gate module 10 is used as a "NAND" logic gate.

The "OR" logic gate module 10 can be changed into a "AND" logic gate module 10 by providing a low reference value $R_{ref}=R_{min}$ to the sense amplifier 11.

Table 2 summarizes the response of the logic gate module 10 when configured to be used as a "OR", NAND", "NOR", "AND" and "XOR" logic gate, as a function of the user input and of the reference value $R_{ref}$. In order to use the logic gate module 10 as a "XOR" logic gate, the storage magnetization 230 can be programmed as to be oriented as in FIG. 5 or in FIG. 6. An intermediate value of the reference value $R_{ref}=R_{int}$ is provided in the sense amplifier 11 such that a match "0" is obtained when the sense magnetization 210 is oriented parallel or antiparallel to the storage magnetization 230.

TABLE 2

| user input | | $R_{max}$ | | $R_{min}$ | | $R_{min}$ & $R_{max}$ |
|---|---|---|---|---|---|---|
| A | B | OR | NAND | NOR | AND | XOR |
| 0 | 0 | 0 | 1 | 1 | 0 | 0 |
| 0 | 1 | 1 | 1 | 0 | 0 | 1 |
| 1 | 0 | 1 | 1 | 0 | 0 | 1 |
| 1 | 1 | 1 | 0 | 0 | 1 | 0 |

An exemplary logic gate module used as a 1-bit configuration is shown in FIG. 8 wherein during the programming step and the inputting step, the sense magnetization 210 is oriented either parallel or antiparallel to the storage magnetization 230. FIG. 8 schematically shows the relative orientations of the storage magnetization 230 and the sense magnetization 210 for the logic gate module 10 used as a 1-bit configuration. Specifically, the storage magnetization 230 is oriented in a programmed direction pointing towards the right (FIGS. 8a and 8b) and pointing towards the left (FIGS. 8c and 8d). A user input is then inputted in the layer 21 such as to orient the sense magnetization 210 in a read direction that is either oriented parallel to the storage magnetization 230 (FIGS. 8a and 8d) yielding a low junction resistance $R_{MTJ}=R_{min}$ or antiparallel to it (FIGS. 8b and 8c), yielding a high junction resistance $R_{MTJ}=R_{max}$. In the case a reference value of $R_{Ref}=R_{max}$ is provided in the sense amplifier 11, a logic state of "0" is obtained for $R_{MTJ}=R_{min}$ and a logic state of "1" is obtained for $R_{MTJ}=R_{max}$. Using the logic gate module 10 as the 1-bit cell does not allow distinguishing the user input "11" from the user input "00. Consequently, the 1-bit logic gate module 10 can be used as a "XOR" logic gate but not as a "NAND" logic gate.

In another embodiment, the logic gate module 10 is used as any one of a A·notB, notA·B, A+notB or a notA+B logic gates.

FIG. 9 represents the relative orientation of the storage magnetization 230 and of the sense magnetization 210 were the storage magnetization 230 has been programmed in a programmed direction pointing upwards. A user input is then inputted in the layer 21 such as to orient the sense magnetization 210 successively in a direction orthogonal to the storage magnetization 230 and yielding an intermediate junction resistance $R_{MTJ}=R_{int}$ (FIGS. 9a and 9d), parallel to the storage magnetization 230 yielding a low junction resistance $R_{MTJ}=R_{min}$ (FIG. 9b), and antiparallel to the storage magnetization 230 yielding a high junction resistance $R_{MTJ}=R_{max}$ (FIG. 9c). Here, matching occurs when the user input orients the sense magnetization 210 antiparallel to the storage magnetization 230 (FIG. 9c), corresponding to the junction resistance $R_{MTJ}=R_{max}$ and when the reference value $R_{ref}=R_{max}$ is provided to the sense amplifier 11. This corresponds to a "$\overline{A}+B$" logic gate. The logic gate module 10 with the storage magnetization 230 in the configuration of FIG. 9 can be used as a $\overline{A}\cdot B$ logic gate by providing a reference value $R_{ref}=R_{min}$ to the sense amplifier 11.

In order to use the "$\overline{A}+B$" logic gate module 10 as a "$A+\overline{B}$" logic gate module 10, the storage magnetization 230 has to be reprogrammed such as to orient the storage magnetization 230 downwards, i.e., in a direction that is opposed to the one illustrated in FIG. 9 (see FIG. 10) and a reference value $R_{ref}=R_{max}$ has to be provided to the sense amplifier 11. The logic gate module 10 with the storage magnetization 230 in the configuration of FIG. 10 can be used as a $A\cdot\overline{B}$ logic gate by providing a reference value $R_{ref}=R_{min}$ to the sense amplifier 11.

Table 3 summarizes the response of the logic gate module 10 when configured to be used as a "$\overline{A}+B$", "$A+\overline{B}$", "$\overline{A}\cdot B$" and "$A\cdot\overline{B}$" logic gate, as a function of the user input and of the reference value $R_{ref}$.

In another embodiment shown in FIG. 11, the logic gate module 100 comprises a plurality of the AIM-MRAM cells 1 arranged in an array of rows and columns. A plurality of the first field lines 4 are magnetically coupled to the AIM-MRAM cells 1 along a row and a plurality of the second field lines 4, substantially orthogonal to the field line 4, are magnetically coupled to the AIM-MRAM cells 1 along a column. In the example of FIG. 11, four AIM-MRAM cells 1 are magnetically coupled along a row to a first field line 4 and magnetically coupled along a column to a second field line 5.

Figure 12:
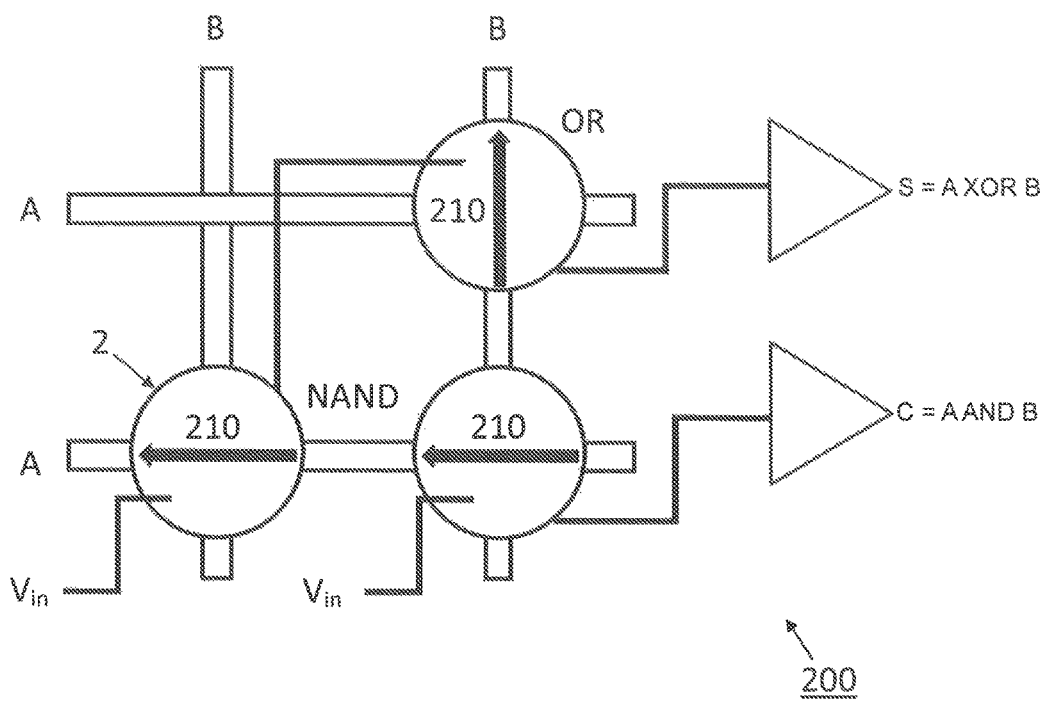
FIG. 12 shows the logic gate module configured such that it can be used as a half adder circuit.

To sense the output, first the sense circuit (comparator) samples the Rmax with all the FLs disabled, then considers the users input and samples back the resistance of the AIM stacks in series. Finally, the sense compares this value to the reference Rmax In yet another embodiment shown in FIG. 12, the logic gate module 200 is configured such that it can be used as a half adder circuit. Such half adder adds two single binary digits A and B. It has two outputs, sum S and carry C. The carry signal C represents an overflow into the next digit of a multi-digit addition. The value of the sum is 2C+S. The simplest half-adder design incorporates an "XOR" gate for S and an "AND" gate for C.

TABLE 3

| user input | | $R_{max}$ | | $R_{min}$ | |
|---|---|---|---|---|---|
| A | B | $A+\overline{B}$ | $\overline{A}+B$ | $\overline{A}\cdot B$ | $A\cdot\overline{B}$ |
| 0 | 0 | 1 | 1 | 0 | 0 |
| 0 | 1 | 0 | 1 | 1 | 0 |
| 1 | 0 | 1 | 0 | 0 | 1 |
| 1 | 1 | 1 | 1 | 0 | 0 |

Figure 13:
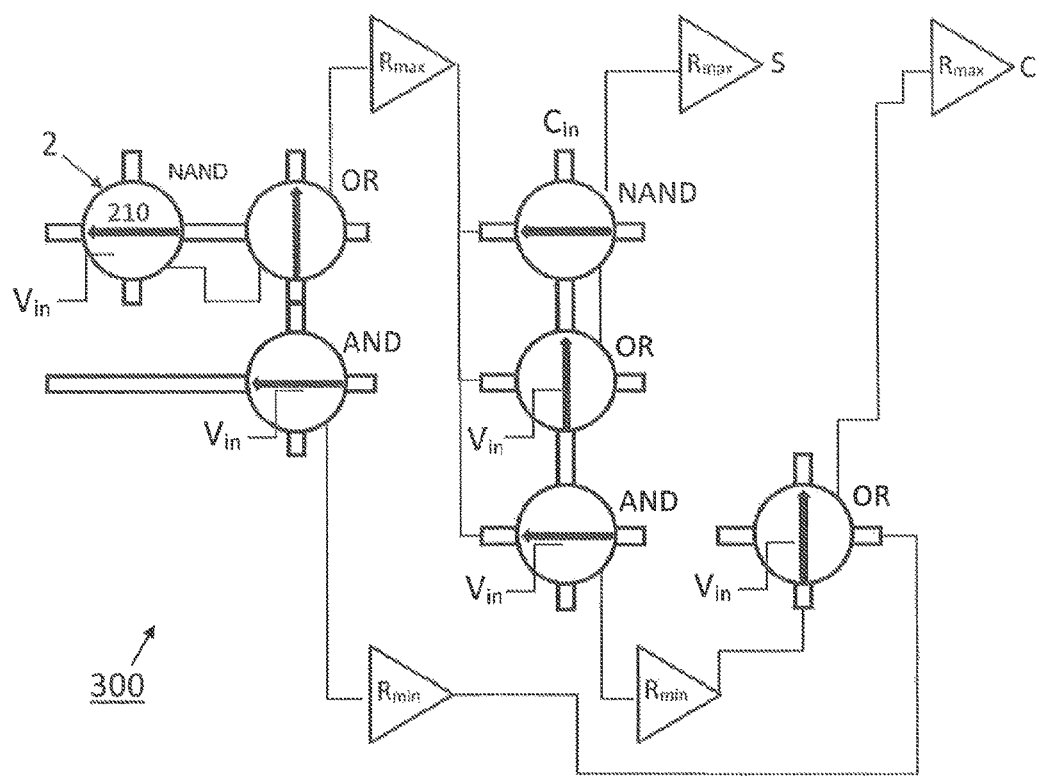
FIG. 13 shows the logic gate module configured such that it can be used as a full adder circuit.

With the addition of an "OR" gate to combine their carry outputs, two half adders can be combined to make a full adder. FIG. 13 shows the logic gate module 300 configured such that it can be used as a full adder circuit. Such a full adder adds binary numbers and accounts for values carried in as well as out.

Specifically, the full adder adds three one-bit numbers A, B, and $C_{in}$. The one-bit numbers A and B are the operands, and $C_{in}$ is a bit carried in from the previous less significant stage. The full adder circuit 300 produces a two-bit output, output carry and sum typically represented by the signals $C_{out}$ and S, where sum=$2C_{out}$+S.

A full adder can be constructed from two half adders by connecting A and B to the input of one half adder, connecting the sum from that to an input to the second adder, connecting Ci to the other input and OR the two carry outputs. The critical path of a full adder runs through both XOR-gates and ends at the sum bit S.

While the invention has been described with reference to the specific embodiments thereof, it should be understood by those skilled in the art that various changes may be made and equivalents may be substituted without departing from the scope of the invention as defined by the appended claims.

For example, and as discussed above, the storage magnetization 230 and the sense magnetization 210 can be aligned at any distinct values of θ in the range of 0° to 360° such that m logic states can be encoded, with each logic state assigned to a distinct value of θ.

By varying the signs and magnitudes of Hx and Hy, namely by varying the directions and magnitudes of the first and second programming currents 41, 52 through the first field line 4 and the second field line 5, distinct values of θ are obtained in the range of 0° to 360°. Because the storage magnetization direction can be aligned according to θ, m logic states can be encoded, with each logic state assigned to a distinct value of θ. In fact, the AIM-MRAM cell 1 can store an infinite number of different logic states comprised between a junction resistance $R_{MTJ}$, and including, $R_{max}$ and $R_{min}$.

Figures 14A, 14B, 14C, 14D:
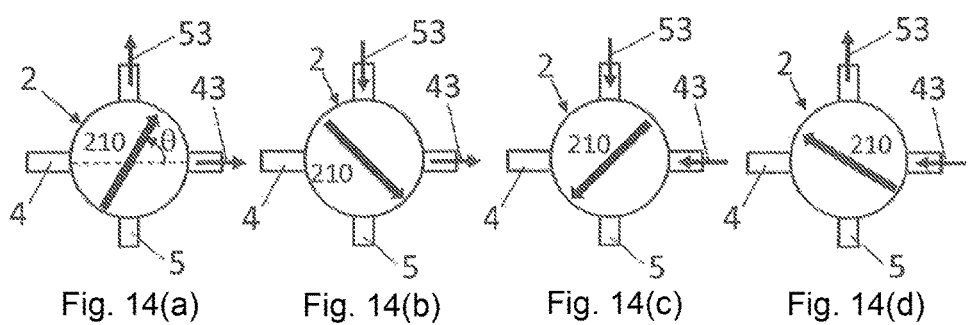
FIGS. 14(a)-(d) shows a top view of the MRAM cell illustrating a sequence of activation of the first and second field lines, according to another embodiment.

FIG. 14 shows the first read current 43 passing in the first field line 4 and the second read current 53 passing in the second field line 5, according to an embodiment. FIG. 15 shows a table reporting combinations of the first read current 43 passing in the first field line 4 and second read current 53 passing in the second field line 5 and corresponding to user inputs A and B. In FIG. 14a, the first and second read currents 43, 53 are passed with a first polarity (represented by the sign "1" in table 4) such that the sense magnetization 210 is aligned with an angle that is comprised between 0° and 90°. In FIG. 14b, the second read current 53 is passed with a second polarity (represented by the sign "−1" in table 4), opposed to the first polarity. The first read current 43 is passed with the same polarity as in FIG. 14a. The sense magnetization 210 is aligned with an angle that is comprised between 270° and 360°.

TABLE 4

| user input | | read current | |
|---|---|---|---|
| A | B | first field line | second field line |
| 0 | 0 | 1 | 1 |
| 0 | 1 | −1 | 1 |
| 1 | 0 | 1 | −1 |
| 1 | 1 | −1 | −1 |

In FIG. 14c, both the first and second read currents 43, 53 are passed with the second polarity such that the sense magnetization 210 is aligned with an angle that is comprised 180° and 270°. In FIG. 13d, the first read current 43 is passed with the second polarity while the second read current 53 is passed with the first polarity such that the sense magnetization 210 is aligned with an angle that is comprised between 90° and 180°. The exact angle made by the sense magnetization 210 will depend on the relative magnitude of the first and second read current 43, 53.

FIG. 14 shows a table that reports a plurality of combinations of the first read current 43 passing in the first field line 4 (indicated as FL1 in FIG. 14) and second read current 53 passing in the second field line 5 (indicated as FL2 in FIG. 14) and corresponding to user inputs A, B and D.

REFERENCE NUMBERS AND SYMBOLS

1 MRAM cell
10 logic gate module
100 logic gate module array
11 sense amplifier
2 magnetic tunnel junction
200 half adder circuit
21 sense layer
210 sense magnetization
22 spacer layer
23 storage layer
230 storage magnetization
24 storage pinning layer
3 bit line
31 heating current
32 sense current
300 full adder circuit
4 field line, first field line
41 first programming current
42 first programming magnetic field
43 first read current
44 first read magnetic field
5 second filed line
51 second programming current
52 second programming magnetic field
53 second read current
54 second read magnetic field
7 strap
8 selection transistor
θ Angle
C carry
$C_{out}$ output carry
Hx x-component of the first programming magnetic field
Hy y-component of the second programming magnetic field
$R_{int}$ intermediate junction resistance
$R_{max}$ high junction resistance
$R_{min}$ low junction resistance
$R_{MTJ}$ junction resistance
$R_{ref}$ reference value
S sum
$T_H$ high threshold temperature
$T_L$ low threshold temperature

What is claimed is:

1. A logic gate module for performing logic functions comprising a MRAM cell including a magnetic tunnel junction comprising a sense layer having a sense magnetization, a storage layer having a storage magnetization, and a spacer layer between the sense and the storage layers, the MRAM cell having a junction resistance determined by the degree of alignment between the sense magnetization and the storage magnetization;
   wherein, during a programming operation, the storage magnetization is switchable between m directions to store data corresponding to one of m logic states, with m≥4; and
   wherein, during a user input operation, the sense magnetization is switchable between said m directions in accordance with a user input, such that the MRAM cell is usable as a n-bit cell with n≥2;
   the logic gate module further comprising a comparator for comparing the junction resistance with a reference value and outputting a digital signal indicating a difference between the junction resistance and the reference value, wherein by providing said digital signal based on a selected reference value and a programmed direction of the storage magnetization and in response to the user input orientation, the logic gate module is able to perform a logic function of said user input, said logic function being one of said logic functions and being associated to the selected reference value and the programmed direction;
   the reference value being selectable to have: a value substantially equal to a maximum value corresponding to the sense and storage magnetizations being antiparallel, such that the logic gate module is configured to perform the logic functions "OR", NAND", "A+notB" or "notA+B"; a value substantially equal to a minimum value corresponding to the sense and storage magnetizations being parallel, such that the logic gate module can perform the logic functions "NOR" or "AND", "A.notB" or "notA.B"; and a value substantially equal to an intermediate value corresponding to a value between the maximum value and the minimum value, such that the logic gate module is configured to perform the logic function "XOR".

2. The logic gate module according to claim 1, further comprising a first field line and a second field line that are each magnetically coupled to the MRAM cell; and
   wherein during the user input operation, the first field line is configured to apply a first read current to induce a first read magnetic field and the second field line is configured to apply a second read current to induce a second read magnetic field.

3. The logic gate module according to claim 2, wherein the first field line is substantially orthogonal to the second field line.

4. The logic gate module according to claim 2,
   wherein, during user input operation, the sense magnetization direction is switched to a particular one of the m directions in accordance with at least one of the first read magnetic field and the second read magnetic field.

5. The logic gate module according to claim 1, further comprising a bit line electrically connecting the magnetic tunnel junction and arranged for passing a sense current though the magnetic tunnel junction for measuring the junction resistance.

6. The logic gate module according to claim 5, wherein the bit line is connected to an input of the comparator, another input of the comparator being the reference value.

7. The logic gate module according to claim 6, wherein the comparator is a sense amplifier.

8. A logic gate circuit comprising a plurality of the MRAM cell and a comparator according to claim 1, the MRAM cells being arranged in an array of rows and columns; each row being magnetically coupled with a first field line and each column being magnetically coupled with a second field line.

9. A half adder circuit comprising a first circuit including a first and a second MRAM cell arranged in series and a comparator, said first circuit for performing an XOR logic function and a logic gate module according to claim 1 the logic date module configured to perform an "AND" logic function, such that the circuit can perform the function of the half adder circuit.

10. A full adder circuit comprising two half adder circuits, each half adder circuit comprising a first circuit including a first and a second MRAM cell arranged in series and a comparator, said first circuit for performing an XOR logic function and a logic gate module according to claim 1 the logic date module configured to perform an "AND" logic function, such that the circuit can perform the function of the half adder circuit; and a logic gate module according to claim 1, configured for providing a "OR" logic function; the two half adder circuits and the logic gate module being configured such that they perform the function of the full adder circuit.

11. Method for operating a logic gate module comprising a MRAM cell including a magnetic tunnel junction comprising a sense layer having a sense magnetization, a storage layer having a storage magnetization, and a spacer layer between the sense and the storage layers, the MRAM cell having a junction resistance determined by the degree of alignment between the sense magnetization and the storage magnetization;

wherein, during a programming operation, the storage magnetization is switchable between m directions to store data corresponding to one of m logic states, with m≥4; and wherein, during a user input operation, the sense magnetization is switchable between said m directions in accordance with a user input, such that the MRAM cell is usable as a n-bit cell with n≥2;

the logic gate module further comprising a comparator for comparing the junction resistance with a reference value and outputting a digital signal indicating a difference between the junction resistance and the reference value, wherein by providing said digital signal based on a selected reference value and a programmed direction of the storage magnetization and in response to the user input orientation, the logic gate module is able to perform a logic function of said user input, said logic function being one of said logic functions and being associated to the selected reference value and the programmed direction;

the reference value being selectable to have: a value substantially equal to a maximum value corresponding to the sense and storage magnetizations being antiparallel, such that the logic gate module is configured to perform the logic functions "OR", NAND", "A+notB" or "notA+B"; a value substantially equal to a minimum value corresponding to the sense and storage magnetizations being parallel, such that the logic gate module can perform the logic functions "NOR" or "AND", "A.notB" or "notA.B", and a value substantially equal to an intermediate value corresponding to a value between the maximum value and the minimum value, such that the logic gate module is configured to perform the logic function "XOR"

the method comprising during a programming operation for performing logic functions, programming the storage magnetization in one of the m directions to store data corresponding to one of m logic states, with m≥4;

providing a reference value to the comparator;

during a user input operation, activating at least one of the first field line and the second field line to induce a set of read magnetic fields to vary the sense magnetization from an initial one of m directions to another one of the m directions, with m≥4;

measuring a junction resistance of the magnetic tunnel junction; and comparing the junction resistance of the magnetic tunnel junction with the reference value;

wherein the reference value is selected to a value:

substantially equal to the maximum value such that the logic gate module performs the logic functions "OR", NAND", "A+notB" or "notA+B";

substantially equal to the minimum value, such that the logic gate module performs the logic functions "NOR" or "AND", "A.notB" or "notA.B"; or substantially equal to the intermediate value, such that the logic gate module performs the logic function "XOR".

12. The method according to claim 11, wherein said programming the storage layer comprises:

heating the magnetic tunnel junction to a high threshold temperature;

activating at least one of the first field line and the second field line to induce a set of programming magnetic fields to vary the storage magnetization from an initial one of the m directions to another one of the m directions.

* * * * *